(12) United States Patent
Kelkar et al.

(10) Patent No.: US 6,822,315 B2
(45) Date of Patent: Nov. 23, 2004

(54) APPARATUS AND METHOD FOR SCRIBING SEMICONDUCTOR WAFERS USING VISION RECOGNITION

(75) Inventors: Nikhil V. Kelkar, San Jose, CA (US); Luu T. Nguyen, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 137 days.

(21) Appl. No.: 10/076,818

(22) Filed: Feb. 14, 2002

(65) Prior Publication Data

US 2003/0153179 A1 Aug. 14, 2003

(51) Int. Cl.[7] .................. H01L 23/544; H01L 21/301
(52) U.S. Cl. ........................ 257/620; 438/462
(58) Field of Search .................. 355/53; 257/620; 349/113; 372/46; 251/129.16; 438/462, 33, 68

(56) References Cited

U.S. PATENT DOCUMENTS

| 6,131,880 A | * | 10/2000 | Hahn et al. ............ 251/129.16 |
| 6,275,277 B1 | * | 8/2001 | Walker et al. ............... 349/113 |
| 6,583,032 B1 | * | 6/2003 | Ishikawa et al. ............. 438/462 |
| 6,590,919 B1 | * | 7/2003 | Ueta ............................ 372/46 |
| 2003/0038343 A1 | * | 2/2003 | Hasegawa .................... 257/620 |

* cited by examiner

Primary Examiner—Peter B. Kim
(74) Attorney, Agent, or Firm—Beyer Weaver & Thomas LLP

(57) ABSTRACT

An apparatus and method for scribing a semiconductor wafer coated with a substantially opaque material using vision recognition is disclosed. The apparatus includes a stage configured to hold a wafer, an imaging unit configured to generate an image of the wafer, and a computer configured to identify the coordinates of the scribe lines on the wafer from the image. During operation, the wafer is imaged using the imaging unit. The computer then identifies the coordinates of the scribe lines on the wafer from the image. Thereafter the coordinates are provided to a dicing machine which performs the dicing of the wafer. Accuracy is therefore improved since the dicing machine relies on the coordinates of the scribe lines as opposed to attempting to recognize the scribe lines through the opaque material. According to various embodiments of the invention, the imaging unit may use infrared, X-ray or ultrasound waves to generate the image of the wafer.

14 Claims, 2 Drawing Sheets

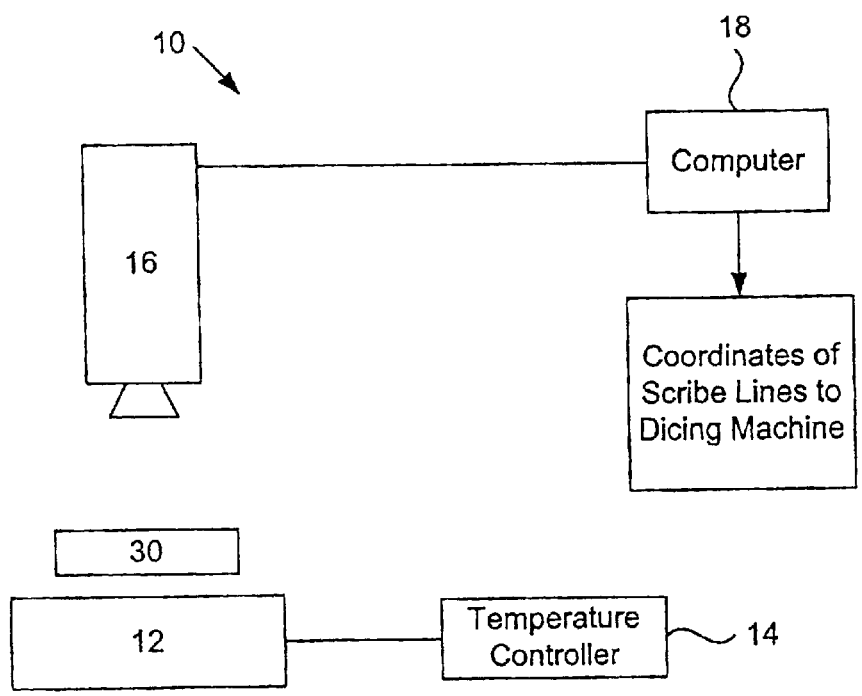
Figure 1
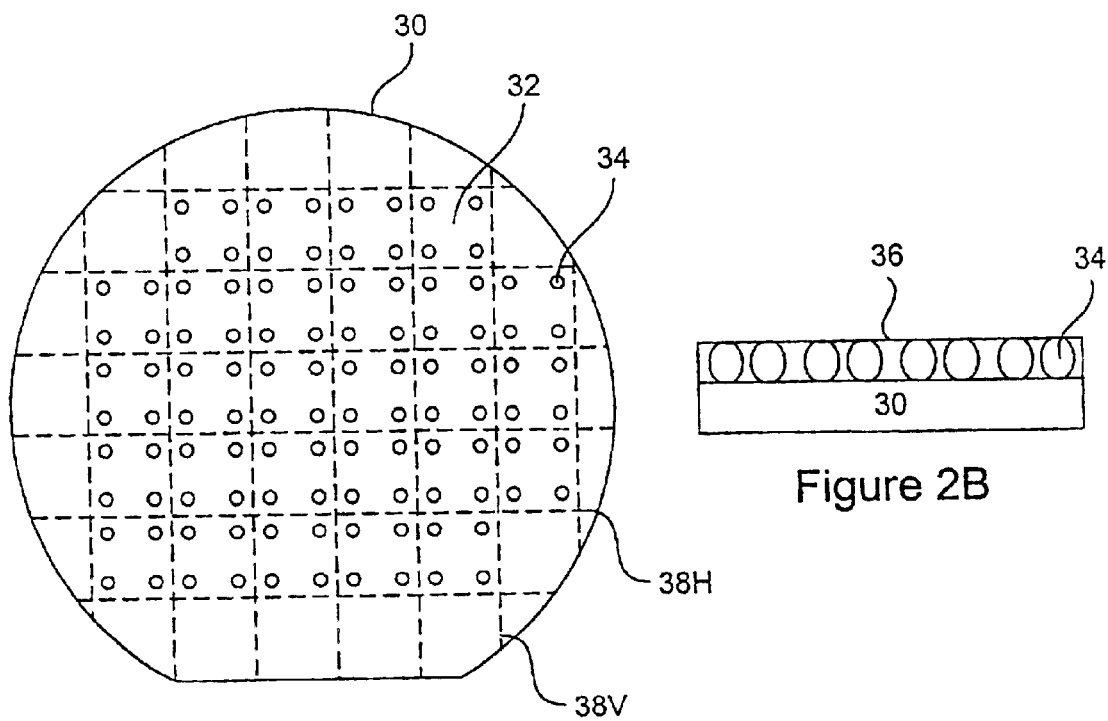
Figure 2B
Figure 2A

APPARATUS AND METHOD FOR SCRIBING SEMICONDUCTOR WAFERS USING VISION RECOGNITION

FIELD OF THE INVENTION

The present invention relates generally to semiconductors, and more particularly, to the scribing of semiconductor wafers using vision recognition.

BACKGROUND OF THE INVENTION

Micro surface mount devices (micro SMDs) are semiconductor chips that are designed to be mounted directly onto a printed circuit board, Individual micro SMD chips are initially fabricated in wafer form using standard semiconductor processing techniques. Each micro SMD includes integrated circuitry and solder contact balls. Horizontal and vertical scribe lines of aluminum or some other type of conductive metal separate each micro SMD chip on the wafer.

A fabricated wafer undergoes a number of steps to prepare the micro SMD chips for mounting onto a printed circuit board. Initially the back surface of the wafer is grinded to reduce its thickness and then coated with an epoxy material. The epoxy prevents chipping of the wafer during dicing. It also provides a surface for marking the chips with part numbers, company logos, and the like. Next the wafer is probed and each micro SMD chip is individually tested to identify operational and non-operational devices. A dicing machine then saws the wafer, along the scribe lines, to separate the individual chips from one another. During the mounting process, the solder balls on a micro SMD chip are aligned with electrical contact pads on the board. The board is subsequently heated causing the metal of the solder balls to flow, forming an electromechanical joint between the chip and the contact pads on the board. In a final step, an underfill epoxy material is introduced between the chip and the board. The board is again heated, causing the epoxy to cure. The cured epoxy forms a seal around the chip that protects it from moisture and helps preserve the integrity of the joints. For more information on micro SMD packaging, see "MicroSMD—A Wafer Level Chip Scale Package", by N. Kelkar, Mathew H. Takiar and L. Nguyen, IEEE Transactions on Advanced Packaging, Special Issue on Wafer Level Packaging, pp. 227–232, Vol. 23, No. 2, May 2000.

In U.S. Pat. No. 6,245,595 entitled "Techniques for Wafer Level Molding of Underfill Encapsulant", assigned to the assignee of the present invention and incorporated by reference herein for all purposes, an improvement to the aforementioned micro SMB fabrication and mounting process is described. This improvement involves providing either a cured or a partially cured epoxy layer on the top surface of the wafer before it is diced. The epoxy layer not only protects the chips during handling, but also eliminates the need of the underfill epoxy material after the chip is mounted onto the printed circuit board. The epoxy layer formed on the top surface of the wafer includes a number of components, including an epoxy resin, a hardener, a catalyst, a filler material such as silicon particles and a dye. The silicon particles reduce the coefficient of thermal expansion of the epoxy to match that of the printed circuit board upon which the micro SMD will be mounted. When variations of temperature occur, the board and epoxy expand and contract at substantially the same rate. Without the filler particles, the rates of expansion and contraction would be different, resulting in potential failures of the joints over time. The filler particles and dye also tend to make the epoxy layer opaque which protects the micro SMD from exposure to light. Since many micro SMDs include analog circuitry that is light sensitive, the opaque epoxy layer helps maintain the proper operation of the chip in the presence of light.

The issue with the aforementioned improvement is that the opaque epoxy layer on the top surface of the wafer reduces the visibility of the scribe lines. It is therefore difficult for the dicing machine to recognize the scribe lines, often resulting in inaccurate cuts during dicing. Consequently damage to some of the chips during the cutting process may occur.

An apparatus and method for scribing wafers using vision recognition to enhance the recognition of the scribe lines through the opaque epoxy on the surface of the wafer is therefore needed.

SUMMARY OF THE INVENTION

To achieve the foregoing, and in accordance with the purpose of the present invention, an apparatus and method for scribing a semiconductor wafer coated with a substantially opaque material using vision recognition is disclosed. The apparatus includes a stage configured to hold a wafer, an imaging unit configured to generate an image of the wafer, and a computer configured to identify the coordinates of the scribe lines on the wafer from the image. During operation, the wafer is imaged using the imaging unit. The computer then identifies the coordinates of the scribe lines on the wafer from the image. Thereafter the coordinates are provided to a dicing machine which performs the dicing of the wafer. Accuracy is therefore improved since the dicing machine relies on the coordinates of the scribe lines as opposed to attempting to recognize the scribe lines through the opaque material. According to various embodiments of the invention, the imaging unit may use infrared, X-ray or ultrasound waves to generate the image of the wafer.

BRIEF DESCRIPTION OF THE DRAWINGS

The invention, together with further advantages thereof, may best be understood by reference to the following description taken in conjunction with the accompanying drawings in which:

FIG. 1 is a block diagram of the vision recognition system which generates a picture of a semiconductor wafer according to the present invention.

FIGS. 2A and 2B are a top view and cross section view of a wafer covered with epoxy.

DETAILED DESCRIPTION OF THE INVENTION

Figure 3:
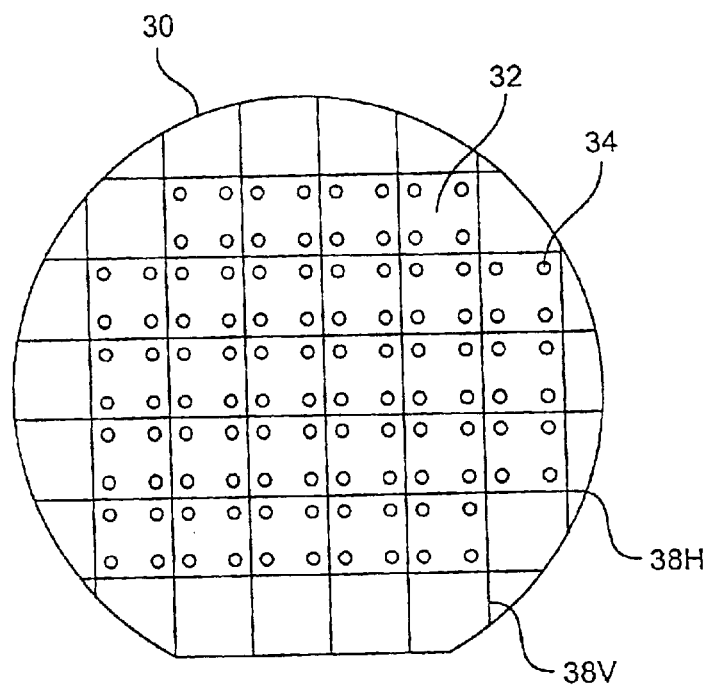
FIG. 3 is a picture of the wafer of FIG. 2 generated using the vision recognition system of the present invention.

Referring to FIG. 1, a block diagram of the vision recognition system according to one embodiment of the present invention is shown. The vision recognition system 10 includes a heating stage 12, a temperature controller 14 for controlling the temperature of the heating stage 12, an infrared (IR) camera 16 and a computer 18. In one embodiment, the IR camera 16 and computer 18 are provided in a single system such as that provided by FLIR Systems of Portland, Oreg.

In one embodiment, the FLIR Model number IQ812 is used. This system includes an IR detector including (but not shown) a four element IR detector array, a split Sterling electric cooler, a hermetically sealed package, and a detector biasing network which responds to IR in the 8.0 to 12.0 micrometer spectrum. Each detector of the array changes resistance when irradiated, creating a voltage variation across a biasing resistor of the biasing network. The photoconductive response of the detector produces an output voltage that varies proportionally to the detected radiation intensity. The image of the wafer is thus generated from the output voltages of the detectors. The optical lens used in this system is a germanium IR transparent window that protects the imager electronics from the external environment. It also passes the IR radiation through the collecting aperture and onto the detecting element. In alternative embodiments, similar IR systems from FLIR or other companies may be used.

Referring to FIG. 2A, a top view of a wafer 30 is shown. The wafer includes a plurality of micro SMD chips 32 each having a plurality of solder balls 34. Although not illustrated in this figure, an opaque epoxy layer 36 is provided across the top surface of the wafer 30. Accordingly the horizontal and vertical scribe lines that separate the chips 32 on the wafer are illustrated by dashed lines 38H and 38V indicating that the scribe lines are present on the surface of the wafer 30 but are not readily visible through the opaque epoxy layer 36. Referring to FIG. 2B, a cross section of the wafer 30 is shown. As is clearly illustrated in this figure, the opaque epoxy layer 36 is provided across the top surface of the wafer 30.

Referring to FIG. 3, an image of the wafer of FIG. 2 as generated by the IR camera 16 and computer 18 is shown. As can be readily seen in this image, the horizontal and vertical scribe lines 38H and 38V are readily visible and are thus illustrated as solid lines and not dashed lines as in FIG. 2A. The position of the horizontal and vertical scribe lines 38H and 38V along with a stepping index (the distance between adjacent scribe lines) are provided to a dicing machine. With this information, the dicing machine can accurately dice the wafer along the scribe lines 38H and 38V without these lines being visible.

In various embodiments, the dicing process can be set up either in semi-automatic or full automatic modes. In the semi-automatic mode, operator intervention is required. In this case, the operator needs to look at the IR image and identify the key fiducials at the edge of the wafer. Depending on the front-end process, such fiducials can be located only at the top of the wafer, or at various locations (e.g., top, bottom, right and left). The outline and dimensions of the die are also input into the system by the operator. With such information, the dicing machine can automatically use the fiducials as reference points and set the indexing step based on the die dimensions entered, knowing the width of the scribe lines and the particular wafer saw used. In the automatic mode, the process of fiducial identification is accomplished automatically via imaging software (e.g., Image Pro-Plus from Media Cybernetics). The wafer id also automatically identifies the device id and die dimensions to be used for the stepping index.

During operation of the vision recognition system 10, a wafer 30 is placed onto the heating stage 12 and heated to a predefined temperature as determined by the temperature controller 14. The heated wafer 30 generates IR photons or "flux". Generally the higher the temperature, the larger the number of photons detected by the array. In other words, the higher the flux, the "hotter" the image. A detector array (not shown) in the IR camera 16 then creates a map of the wafer 30 based on the flux intensity received by each detector in the array. The computer 18 translates the map into the image of the wafer 30 as illustrated in FIG. 3 and stores it on its hard drive. Since the characteristics of each detector is known, the flux detected by each detector is converted into a temperature reading corresponding to a feature on the wafer 30. For example, when the wafer is heated to 100 degrees Celsius, the IR emissivity of silicon, aluminum and solder is 0.9, 0.09, and 0.3 respectively. Thus major features on the wafer 30 such as the scribe line 38H and 38V can be readily detected though the opaque layer 36. The computer 20 analyzes the image and calculates the (x, y) coordinates of the scribe lines 38H and 38V and the stepping index. This information is then provided to a dicing machine which enables it to perform the dicing of the wafer 30 as described above even though the scribe lines 38H and 38V are not readily visible.

In one embodiment of the invention, the composition of the opaque epoxy 36 includes an epoxy resin, a hardener, a crosslinker, an initiator (catalyst), dye and fillers. The range of properties of the opaque epoxy 36 includes a viscosity of 2,000 to 10,000 millipascals/second, a specific gravity ranging from 1.0 to 1.2, a solvent content of 20% to 40% by weight, a cure time of 20 to 30 minutes under a vacuum at 100 to 130 degrees Celcius, a filler content ranging from 1% to 10% by weight, and a concentration of the dye and filler sufficient to make the epoxy 36 substantially opaque. It should be noted that the above defined composition and properties are exemplary and in no way should be construed as limiting the present invention. Rather it will be readily apparent to those skilled in the art that an epoxy of a wide range of components and properties may be used within the scope of the present invention.

In general, the higher the heating temperature of the wafer 30, the better the image of the wafer 30 generated by the IR camera 16 and the computer 18. However, the temperature of the wafer 30 should not be raised to high. Otherwise the epoxy material 36 and possibly even the solder balls 34 may reflow. In the aforementioned example of the composition of the epoxy 36, the reflow temperature is approximately 100 degrees Celcius. With this embodiment, it is preferable that the wafer be heated no higher than this temperature.

In an alternative embodiment, the camera 16 does not have to see the whole wafer 30, only a specific location (for example the top, bottom, right, or left portions) of the wafer to locate at least two horizontal and two vertical scribe lines 38H and 38V, and measure the stepping index. With this information, the sawing machine can be programmed to automatically index the cuts.

Although the foregoing invention has been described in some detail for purposes of clarity of understanding, it will be apparent that certain changes and modifications may be practiced within the scope of the appended claims. For instance, other imaging technologies such as X-ray or ultrasound could be used. X-Ray imaging would have the best imaging contrast between epoxy and metal. Ultrasound can similarly be used, but would require that the wafer come into contact with water as the medium for transmitting and receiving the ultrasound waves. However, both X-Ray and ultrasound equipment are typically expensive and are not typically used is in a standard semiconductor fabrication, packaging and manufacturing facility. In addition, the present invention may be used with any type of wafer and the epoxy layer 36 can range from clear to completely opaque. Therefore, the described embodiments should be taken as illustrative and not restrictive, and the invention should not be limited to the details given herein but should be defined by the following claims and their full scope of equivalents.

We claim:

1. A method of scribing a semiconductor wafer; comprising:
    imaging the wafer through a layer of opaque material formed on the wafer;
    generating a picture of the wafer from the image of the wafer, the picture identifying the scribe lines of the wafer under the opaque material;
    mapping the coordinates of the identified scribe lines on the wafer from the picture;
    providing the coordinates of the scribe lines to a dining machine;
    scribing the wafer using the coordinates of the scribe lines to singulate individual die on the wafer.

2. The method of claim 1, wherein the wafer is imaged using infrared camera.

3. The method of claim 2 wherein the picture is generated by measuring the emissivity of features on the wafer surface including the scribe lines.

4. The method of claim 1, controlling the dicing of the wafer using the coordinates of the scribe lines.

5. The method of claim 1, wherein the imaging of the wafer further comprises;
    heating the wafer to a predetermined temperature; and
    measuring the emissions of the heated wafer using an infrared camera.

6. The method of claim 5, wherein the predetermined temperature is approximately 90 degrees C. or less.

7. The method of claim 5, wherein the predetermined temperature is less than the reflow temperature of the opaque material on the wafer.

8. The method of claim 1, wherein the wafer is imaged using X-rays.

9. The method of claim 1, wherein the wafer is imaged using ultrasound.

10. An apparatus comprising:
    a stage configured to support a wafer, the wafer having a layer of opaque material formed on the active surface of the wafer;
    an imaging unit configured to generate an image of the wafer through the opaque material when the wafer is on the stage;
    a computer configured to identify the coordinates of scribe lines on the wafer from the image of the wafer; and
    a dicing machine configured to die the wafer using the coordinates of the scribe lines identified by the computer to singulate the die on the wafer.

11. The apparatus of claim 10, further comprising a temperature controller configured to control the temperature of the wafer on the stage.

12. The apparatus of claim 10, wherein the imaging unit is an infrared camera.

13. The apparatus of claim 10, wherein the imaging unit uses X-rays to generate the image of the wafer.

14. The apparatus of claim 10, wherein the imaging unit uses ultrasound waves to generate the image of the wafer.

* * * * *

UNITED STATES PATENT AND TRADEMARK OFFICE
CERTIFICATE OF CORRECTION

PATENT NO.    : 6,822,315 B2
DATED         : November 23, 2004
INVENTOR(S)   : Kelkar et al.

It is certified that error appears in the above-identified patent and that said Letters Patent is hereby corrected as shown below:

Column 5,
Line 11, change "dining machine" to -- dicing machine --.
Line 65, change "using infrared" to -- using an infrared --.

Signed and Sealed this

Twenty-second Day of February, 2005

JON W. DUDAS
*Director of the United States Patent and Trademark Office*